(12) United States Patent
Tanaka

(10) Patent No.: US 10,763,762 B2
(45) Date of Patent: Sep. 1, 2020

(54) VIBRATOR, ULTRASONIC MOTOR, AND OPTICAL DEVICE

(71) Applicant: CANON KABUSHIKI KAISHA, Tokyo (JP)

(72) Inventor: Yasuhiro Tanaka, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 509 days.

(21) Appl. No.: 15/782,541

(22) Filed: Oct. 12, 2017

(65) Prior Publication Data
US 2018/0109204 A1    Apr. 19, 2018

(30) Foreign Application Priority Data

Oct. 17, 2016  (JP) .................. 2016-203344
Sep. 21, 2017  (JP) .................. 2017-180857

(51) Int. Cl.
| | |
|---|---|
| *H01L 41/04* | (2006.01) |
| *H02N 2/00* | (2006.01) |
| *G02B 7/10* | (2006.01) |
| *H01L 41/313* | (2013.01) |
| *G02B 7/08* | (2006.01) |
| *H02N 2/02* | (2006.01) |
| *H01L 41/08* | (2006.01) |

(52) U.S. Cl.
CPC ............. *H02N 2/001* (2013.01); *G02B 7/08* (2013.01); *G02B 7/10* (2013.01); *H01L 41/0815* (2013.01); *H01L 41/313* (2013.01); *H02N 2/0025* (2013.01); *H02N 2/026* (2013.01)

(58) Field of Classification Search
CPC ...... H02N 2/001; H02N 2/0025; H02N 2/026; G02B 7/08; G02B 7/10; H01L 41/0815; H01L 41/313
USPC .......................... 310/311–371, 800
See application file for complete search history.

(56) References Cited

U.S. PATENT DOCUMENTS

| | | | | |
|---|---|---|---|---|
| 2002/0039641 | A1* | 4/2002 | Hayashi | B41M 7/0027 428/32.6 |
| 2013/0025931 | A1* | 1/2013 | Oyama | H01L 21/56 174/564 |
| 2013/0162726 | A1* | 6/2013 | Mizukami | B41J 2/14233 347/70 |
| 2019/0311702 | A1* | 10/2019 | Koike | G10H 3/143 |

FOREIGN PATENT DOCUMENTS

| | | |
|---|---|---|
| JP | H08-300647 A | 11/1996 |
| JP | 2011-073210 A | 4/2011 |
| JP | 5028905 B2 | 9/2012 |
| JP | 2015-126692 A | 7/2015 |
| JP | 2016-096252 A | 5/2016 |

* cited by examiner

*Primary Examiner* — Thomas M Dougherty
(74) *Attorney, Agent, or Firm* — Canon U.S.A., Inc. IP Division

(57) ABSTRACT

A vibrator includes a piezoelectric element including a piezoelectric ceramic having an electrode, a vibration plate, and an adhesive layer between the piezoelectric element and the vibration plate, wherein the adhesive layer is obtained by a resin containing 50 parts by mass or more and 80 parts by mass or less of organic particles having a number average particle size of 5 μm or more and 15 μm or less, relative to 100 parts by mass of the resin.

10 Claims, 6 Drawing Sheets

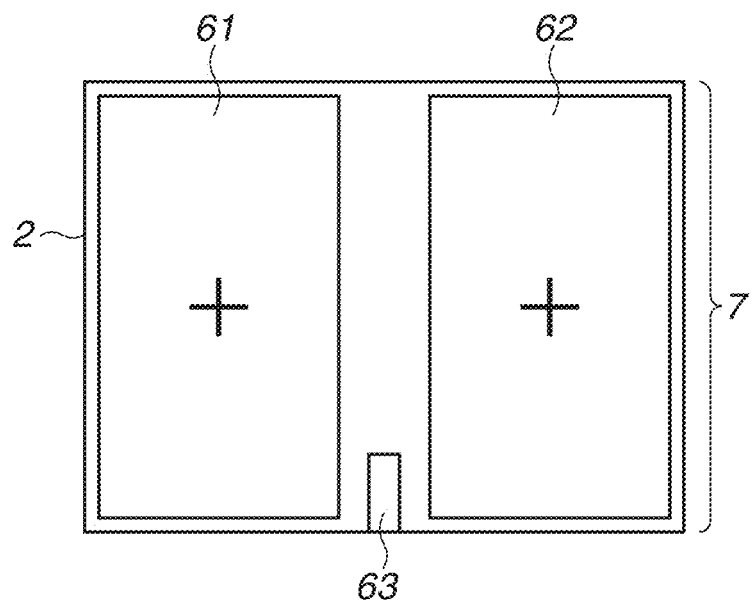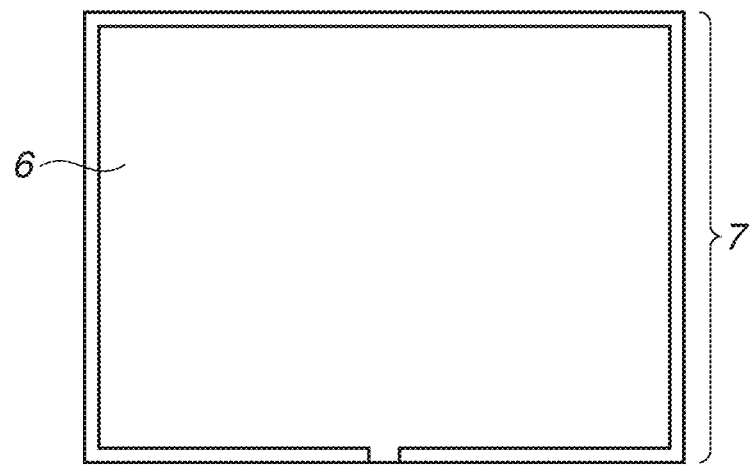

VIBRATOR, ULTRASONIC MOTOR, AND OPTICAL DEVICE

BACKGROUND OF THE INVENTION

Field of the Invention

The present disclosure relates to a bonding technique in an ultrasonic motor in which a vibrator and a friction member move relative to each other, and in particular, relates to an improvement in the bonding between a piezoelectric element and a vibration plate included in a vibrator in an ultrasonic motor.

Description of the Related Art

Conventionally, an imaging apparatus including, as a mechanical portion of a camera or a driving source of a lens, an ultrasonic motor for moving a vibrator and a moving member in frictional contact with each other has been discussed in various ways (e.g., Japanese Patent Application Laid-Open No. 2015-126692). The vibrator is obtained by fixing, with an adhesive, a piezoelectric element, including a piezoelectric ceramic such as lead zirconate titanate (PZT) having silver or copper electrodes, and a vibration plate.

In the process of bonding the vibrator, the thickness of an adhesive layer between the piezoelectric element and the vibration plate is managed to be uniform by controlling the amount of adhesive to be applied and the force of pressurizing the piezoelectric element and the vibration plate.

In the piezoelectric element, however, variations occur in the amount of warp occurring when the piezoelectric element is subjected to a polarization process, and in the surface roughness of the silver or copper electrode. Thus, in the conventional bonding process, due to the variations in the warp of the piezoelectric element or the surface roughness existing before bonding, there is a great variation in the thickness of the adhesive layer even by controlling the amount of adhesive to be applied or the force of pressurizing the piezoelectric element and the vibration plate. To control such the thickness of the adhesive layer, Japanese Patent No. 5028905 discusses, for example, a technique for managing the thickness of an adhesive layer by using an adhesive obtained by mixing fine particles (elastic modulus: 80 GPa) such as silica having a particle size of 1 μm or more and 5 μm or less to bond an electromechanical conversion element such as a piezoelectric element and a fixed member.

If the technique in Japanese Patent No. 5028905 is applied to the ultrasonic motor discussed in Japanese Patent Application Laid-Open No. 2015-126692, an adhesive containing silica fine particles having a particle size of 1 μm or more and 5 μm or less is applied between a piezoelectric element, including a piezoelectric ceramic having an electrode layer, and a vibration plate. Then, the adhesive is heat-cured in the state where the piezoelectric element and the vibration plate are pressurized. After the adhesive is heat-cured, the adhesive is subjected to an ultrasonic flaw inspection as a part of a quality confirmation of a bonded vibrator.

At this time, if a pressurizing force is increased to reduce the thickness of an adhesive layer, a quality problem such as a defect in a bonding portion due to separation of the piezoelectric element and the vibration plate arises in some vibrators.

Further, the piezoelectric element is subjected to a polarization process before bonding. Due to the polarization process, the following new problem also arises. When the piezoelectric element, which is warped about 20 μm, and the vibration plate are pressure-bonded, the silica fine particles in the adhesive cause a crack in the electrode layer of the piezoelectric element, and partial separation occurs at a bonding interface due to the separation between the piezoelectric element and the electrode layer. This partial separation portion of a bonding portion is an abnormal portion found in an ultrasonic flaw inspection.

SUMMARY OF THE INVENTION

The present disclosure is directed to reducing separation occurring in part of a bonded vibration plate when the bonded vibration plate is subjected to an ultrasonic flaw inspection.

In the present disclosure, the bonding between a piezoelectric element and a vibration plate is improved to reduce the aforementioned separation of a bonding portion occurring after adhesive assembly.

According to an aspect of the present disclosure, a vibrator includes a piezoelectric element including a piezoelectric ceramic having an electrode, a vibration plate, and an adhesive layer between the piezoelectric element and the vibration plate, wherein the adhesive layer is obtained by a resin containing 50 parts by mass or more and 80 parts by mass or less of organic particles having a number average particle size of 5 μm or more and 15 μm or less, relative to 100 parts by mass of the resin.

Further features will become apparent from the following description of exemplary embodiments with reference to the attached drawings.

BRIEF DESCRIPTION OF THE DRAWINGS

FIG. 5A and FIG. 5B are schematic diagrams illustrating a piezoelectric element included in the vibrator according to the exemplary embodiment.

DESCRIPTION OF THE EMBODIMENTS

Specific exemplary embodiments will be described below with reference to the drawings.

Figure 1:
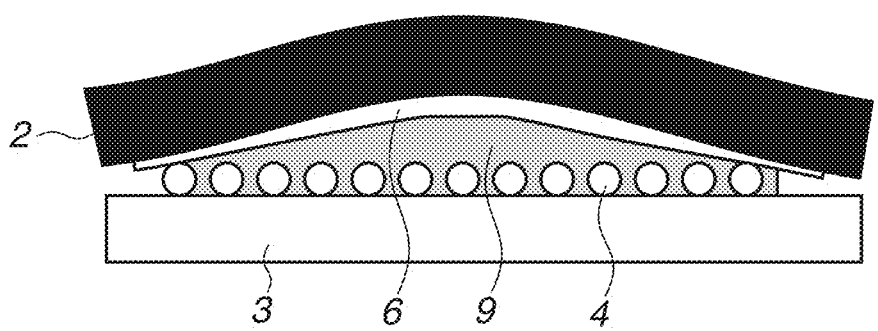
FIG. 1 is a schematic diagram illustrating a state of a vibrator before a piezoelectric element and a vibration plate included in the vibrator according to an exemplary embodiment are pressure-bonded.

FIG. 1 illustrates a state of a vibrator before a piezoelectric element 7, which is warped about 20 μm and includes a piezoelectric ceramic 2 having a silver or copper electrode layer 6, and a vibration plate 3 are pressure-bonded with an adhesive 9 containing organic particles 4. For example, if the thickness of the piezoelectric ceramic 2 is 0.2 mm, the warp of 20 μm means that the piezoelectric element 7 is warped 10% with respect to the thickness of the piezoelectric ceramic 2. As described below, the piezoelectric element 7 is polarized so that a polarization direction of the piezoelectric element 7 is uniform, i.e., only in the same direction. This generates internal strain in the piezoelectric ceramic 2, causing the piezoelectric element 7 to warp.

Figure 2:
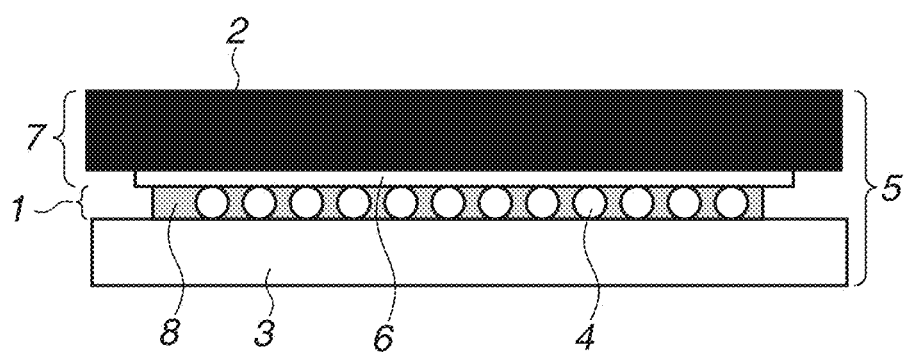
FIG. 2 is a schematic diagram illustrating the vibrator according to the exemplary embodiment obtained by pressure-bonding the piezoelectric element and the vibration plate.

FIG. 2 is a schematic diagram of a vibrator 5 according to an exemplary embodiment. The vibrator 5 includes an adhesive layer 1 between the piezoelectric element 7, which includes the piezoelectric ceramic 2 having the electrode 6, and the vibration plate 3. The adhesive layer 1 includes a resin 8 and the organic particles 4, which are characteristic of the present exemplary embodiment. FIG. 2 illustrates the state of the vibrator 5 after the adhesive 9 is applied between the piezoelectric element 7 and the vibration plate 3, and then, the piezoelectric element 7 and the vibration plate 3 are pressure-bonded.

Examples of the composition of the piezoelectric ceramic 2 used in the vibrator according to the exemplary embodiment include a lead-containing piezoelectric material such as lead zirconate titanate (PZT). This is because a lead-containing piezoelectric material has a high piezoelectric constant and therefore can make loss in an ultrasonic motor caused by a piezoelectric element small.

Alternatively, lead-free piezoelectric materials such as barium calcium zirconate titanate, sodium potassium niobate, bismuth ferrite, sodium niobate, bismuth titanate, and bismuth sodium titanate can also be used. This is because a lead-free piezoelectric material has excellent environmental resistance.

Further, in the specification, a "ceramic" refers to a bulk sintered body having a uniform composition obtained by sintering raw material powder containing a metal element. The thickness of the ceramic is 0.2 mm or more. In terms of facilitation of a polarization process, it is desirable that the thickness should be 1.0 mm or less.

Figure 3A:
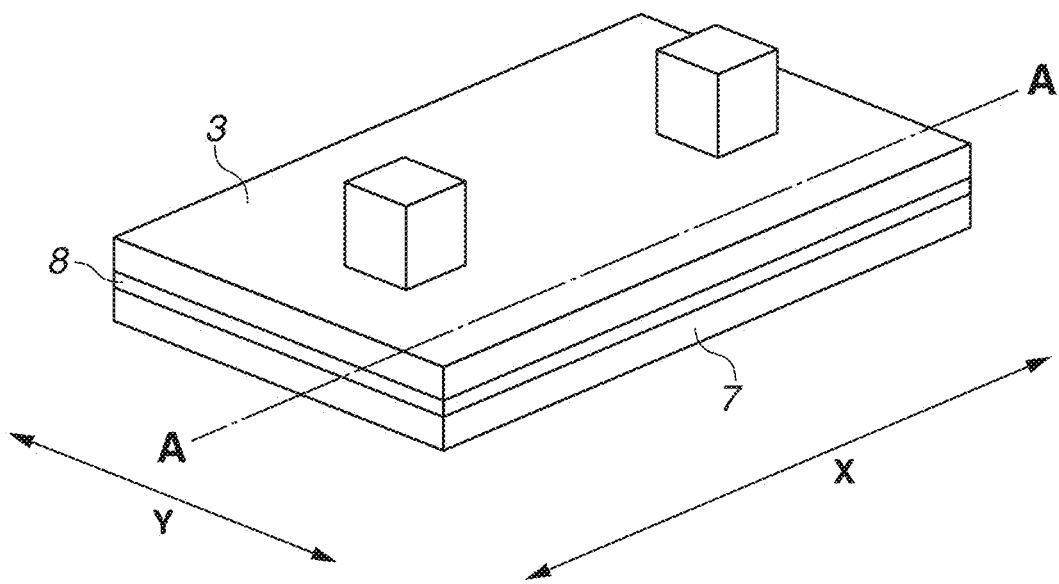
FIG. 3A is a schematic diagram illustrating an example of the vibrator according to the exemplary embodiment.
Figure 3B:
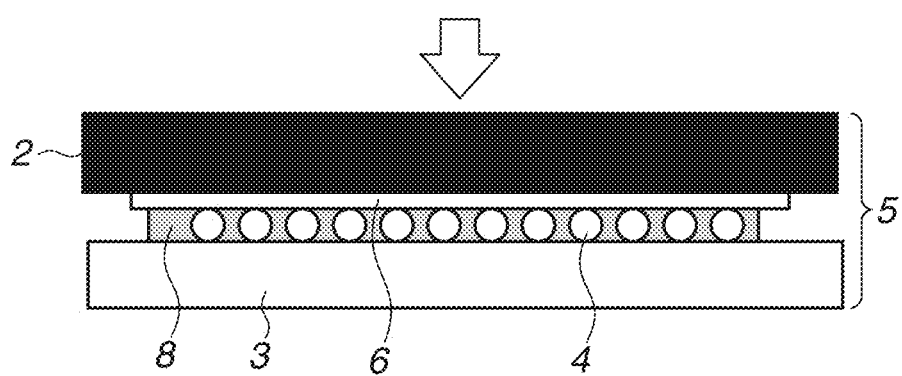
FIG. 3B is a cross-sectional view of the vibrator in FIG. 3A taken along a line A-A.

FIG. 3A is a schematic diagram illustrating an example of the vibrator according to the exemplary embodiment, and FIG. 3B is a cross-sectional view of the vibrator in FIG. 3A taken along a line A-A. As shown in FIG. 3A, the vibrator according to the exemplary embodiment includes an adhesive layer 1 between the piezoelectric element 7 and the vibration plate 3. FIG. 3A illustrates a case where the vibration plate 3 includes a protrusion. Further, as shown in FIG. 3B, the adhesive layer 1 includes the resin 8 and the organic particles 4. FIG. 5A and FIG. 5B are schematic diagrams illustrating the piezoelectric element 7 included in the vibrator 5 according to the exemplary embodiment, where the piezoelectric element 7 includes the electrode 6 and the piezoelectric ceramic 2. In the piezoelectric element 7, electrodes 6, 61, 62, and 63 are attached to opposite surfaces of the piezoelectric ceramic 2 having a cuboid shape. More specifically, an electrode pattern as shown in FIG. 5A is formed on one surface of the piezoelectric ceramic 2. In FIG. 5A, a + sign shows the polarization direction. FIG. 5A illustrates that the polarization process is performed on the piezoelectric element 7 such that the polarization direction is made uniform with respect to the thickness direction of the piezoelectric ceramic 2. On an opposite surface of the piezoelectric ceramic 2, the electrode 6 is attached to a substantially entire surface thereof. The electrode 63 is electrically connected to the electrode 6 on a plane (not illustrated) orthogonal to the opposite surfaces. A setting is made so that if a high-frequency voltage is applied to the vibrator 5, the vibrator 5 resonates in an X direction (longitudinal direction) and in a Y direction (transverse direction) shown in FIG. 3A. The vibrator 5 in FIG. 2, which had been bonded with the adhesive 9 containing the organic particles 4, was subjected to an ultrasonic flaw detection test after the vibrator 5 was adhesively assembled. As a result, the interfacial separation of a bonding portion, which had occurred in the past, decreased.

In this way, it is possible to provide a vibrator with reduced separation of a bonding portion, which has occurred in the past after some vibrator was adhesively assembled.

If an adhesive layer is thickened, the separation of a bonding portion is less likely to occur. Vibration loss, however, becomes large under the influence of the elasticity of the adhesive layer. This causes the loss of impedance characteristics, which are the basic characteristics of an ultrasonic motor.

Next, a description will be given of components contained in the adhesive layer 1 of the vibrator according to the present exemplary embodiment.

The adhesive layer 1 of the vibrator according to the present exemplary embodiment includes the resin and the organic particles 4. As the resin, a thermosetting adhesive can be appropriately selected from an epoxy resin, an acrylic resin, and an alkyd resin and used as a precursor of the resin.

Examples of the organic particles 4 contained in the adhesive layer 1 of the vibrator according to the present exemplary embodiment can include thermosetting resins such as an epoxy resin, an acrylic resin, a phenolic resin, a urethane resin, unsaturated polyester, and polyimide, and thermoplastic resins such as polycarbonate, nylon, polyacetal, polyethylene terephthalate, polysulfone, polyarylate, polyetherimide, polyetheretherketone, polyphenylene sulfide, polyamide-imide, and a liquid-crystal polymer.

It is necessary that 50 parts by mass or more and parts by mass or less of the organic particles 4 relative to 100 parts by mass of the resin are added. It is desirable that 60 parts by mass or more and 70 parts by mass or less of the organic particles 4 should be added.

If the additive content of the organic particles 4 is less than 50 parts by mass, the organic particles 4 are buried in a missing portion of the electrode layer 6 of the piezoelectric element 7 and lose the effect of a spacer for the adhesive layer 1. Further, if the additive content of the organic particles 4 exceeds 80 parts by mass, the adhesive component decreases. Thus, separation is likely to occur.

Further, it is necessary that the particle size of the organic particles 4 is 5 μm or more and 15 μm or less in terms of number average particle size. It is desirable that the particle size should be 10 μm or more and 15 μm or less.

If the particle size of the organic particles 4 is less than 5 μm, the organic particles 4 are buried in the rough surface (surface roughness Ra: 3 μm) of the electrode 6 of the piezoelectric element 7 and lose the effect of a spacer. Further, if the particle size exceeds 15 μm, the adhesive layer 1 also inevitably becomes thick, and the vibration characteristics of an ultrasonic motor drastically deteriorate. Therefore, the vibrator bonded using such an adhesive layer cannot be used for the ultrasonic motor.

It is desirable that the organic particles 4 should be rounded particles or spherical particles. The organic particles 4, however, do not need to be truly spherical.

Further, it is desirable that the elastic modulus of the organic particles 4 should be 0.48 GPa or more and 10.0 GPa or less. It is more desirable that the elastic modulus should be 1.5 GPa or more and 4.0 GPa or less.

If the elastic modulus of the organic particles 4 is less than 0.48 GPa, the organic particles 4 may be crushed when the piezoelectric element 7 and the vibration plate 3 are pressure-bonded, and the organic particles 4 may lose the effect of a spacer. Further, if the elastic modulus exceeds 10.0 GPa, a crack forms in the electrode layer 6 of the piezoelectric element 7 when the piezoelectric element 7 and the vibration plate 3 are pressure-bonded. Then, separation is likely to occur when a high-temperature/high-humidity test is performed. Therefore, the vibrator bonded using such the organic particles may not be able to be used for the ultrasonic motor.

The elastic modulus was measured by producing a cylindrical test piece having dimensions defined by JIS K 7208 "plastic compression test method".

[Method for Preparing Adhesive Composition]

Although illustrated in detail in exemplary embodiments described below, predetermined amounts of adhesive and organic particles are mixed and dispersed by a known mixture/dispersion device, whereby it is possible to obtain the adhesive 9 containing the organic particles 4.

[Method for Bonding Piezoelectric Element and Vibrating Plate]

Using the prepared adhesive 9, an adhesive bonding process is performed as a subsequent process. As a specific method for applying the adhesive 9, the adhesive 9 is placed in a 5-cm$^3$ syringe of a dispenser application device, and a certain amount of the adhesive 9 is applied to the surface of the vibration plate 3.

The vibration plate 3 to which the adhesive 9 is applied is bonded at a pressurizing force of 0.45 MPa with the piezoelectric element 7, which is warped about 20 µm and already polarized.

In the state where the vibration plate 3 and the piezoelectric element 7 are pressurized, the vibration plate 3 and the piezoelectric element 7 are placed in a constant temperature dryer, and the adhesive 9 is cured to form the adhesive layer 1, thereby obtaining the vibrator according to the present exemplary embodiment.

It is desirable that the thickness of the adhesive layer 1 thus obtained by bonding with the adhesive 9 should be 4.1 µm or more and 15.0 µm or less, although depending on the size of the organic particles 4. It is more desirable that the thickness should be 4.1 µm or more and 10.0 µm or less.

[Evaluation of Bonding Interface after Bonding]

As an ultrasonic flaw evaluation after bonding, the vibrator 5 obtained by bonding the vibration plate 3 and the piezoelectric element 7 was placed in a tank for the ultrasonic flaw evaluation, and the separation of a bonding interface was detected based on the presence or absence or the strength of a reflected wave of an ultrasonic wave.

In an ultrasonic image of the vibrator 5 obtained by the ultrasonic flaw evaluation, a separation portion of the bonding interface appeared as a white portion, and the proportion of the white portion to a bonding portion was quantified. The vibrator 5 in which a white portion occurred was evaluated as "NG".

Further, the adhesive strength of the adhesive layer 1 of the vibrator 5 can also be evaluated by a tensile shear strength test. It is sufficient if the adhesive strength of the adhesive layer 1 is 15 MPa or more. It is more desirable that the adhesive strength should be 25 MPa or more.

[Measurement of Average Thickness of Adhesive Layer]

As the measurement of the average thickness of the adhesive layer 1, a longitudinal cross section of the vibrator 5 obtained by bonding the vibration plate 3 and the piezoelectric element 7 was cut, and the thickness of the adhesive layer 1 was observed using a scanning electron microscope (SEM).

To obtain the average thickness of the adhesive layer 1, the area of the adhesive layer 1 was obtained by image processing, which was then divided by the longitudinal length of the adhesive layer 1.

[Evaluation of Dynamic Characteristics of Ultrasonic Motor]

Figure 6:
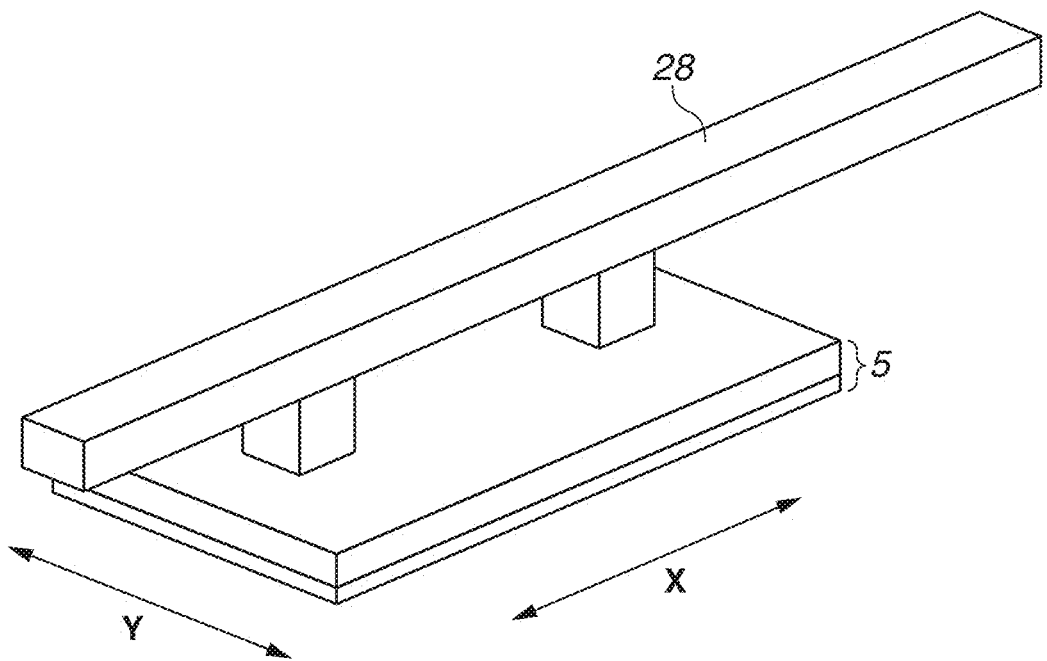
FIG. 6 is a schematic diagram illustrating an example of an ultrasonic motor according to the exemplary embodiment.

An ultrasonic motor according to the present exemplary embodiment is characterized in that the ultrasonic motor includes a moving member 28 in contact with the vibrator 5 according to the present exemplary embodiment. FIG. 6 is a schematic diagram illustrating an example of the ultrasonic motor according to the present exemplary embodiment. In FIG. 6, the moving member 28 is in pressure contact with the vibrator 5 through the protrusions on the vibrator 5. If voltages are applied to the vibrator 5 through a power feeding member 27 by a voltage input unit (not illustrated), traveling waves are generated in the vibration plate 3. Two types of traveling waves are generated. One is the traveling wave which is a secondary out-of-plane vibration in an X direction in FIG. 6 and having three nodal lines parallel to a Y direction in FIG. 6. Another is the traveling wave which is a primary out-of-plane vibration in the Y direction and having two nodal lines parallel to the X direction. The two traveling waves cause elliptic motion in the protrusions of the vibrator 5. Regarding the vibrator 5 obtained in the present exemplary embodiment, the impedance, which is the basic characteristics of an ultrasonic motor, was evaluated. More specifically, the evaluation was made by determining whether there is a great difference from the product standard in frequency at which the moving speed of the motor reaches 100 mm/sec.

If the frequency was shifted from or the moving speed was below the product standard, the vibrator 5 was evaluated as "NG".

[Optical Device]

An optical device according to the exemplary embodiment is characterized by including an ultrasonic motor according to the present exemplary embodiment and optical members dynamically connected to the ultrasonic motor.

Figure 4:
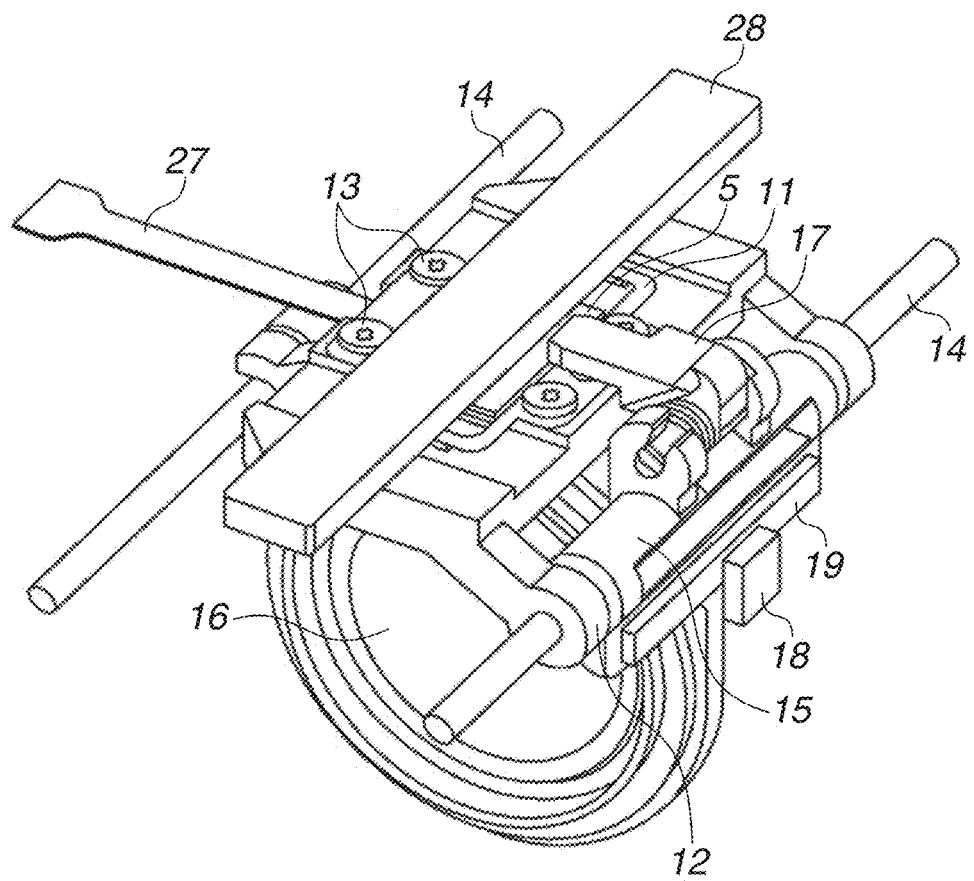
FIG. 4 is a schematic diagram illustrating an example of an optical device according to the exemplary embodiment.

FIG. 4 is a schematic diagram illustrating an example of the optical device according to the present exemplary embodiment (a focus lens unit of a lens barrel device). In FIG. 4, the moving member 28 is in pressure contact with the vibrator 5. If a voltage is applied to the vibrator 5 through a power feeding member 27 by a voltage input unit (not illustrated), a traveling wave is generated in the vibration plate 3.

A holding member 11 is fixed to the vibrator 5 by welding and configured to prevent the generation of unnecessary vibration. A moving housing 12 is fixed to the holding member 11 with screws 13 and unified with the vibrator 5. The ultrasonic motor is formed of these members. The moving housing 12 is attached to two guide members 14, thereby allowing the ultrasonic motor to move straight on the guide members 14.

A lens 16 is fixed to a lens holding member 15 and has an optical axis (not illustrated) parallel to the moving direction of the ultrasonic motor. The lens holding member 15 moves straight on the two guide members 14 similarly to the ultrasonic motor, thereby adjusting the focal position. The two guide members 14 are members for fitting the moving housing 12 and the lens holding member together to allow the moving housing 12 and the lens holding member 15 to move straight. With such a configuration, the moving housing 12 and the lens holding member 15 can move straight on the guide members 14.

Further, a joining member 17 is a member for transmitting a driving force generated by the ultrasonic motor to the lens holding member 15 and is attached to the lens holding member 15 in a fitting manner. This allows the lens holding member 15 to smoothly move together with the moving housing 12 in both directions along the two guide members 14.

Further, a sensor 18 reads position information of a scale 19, which is stuck to a side surface portion of the lens holding member 15, thereby detecting the position of the lens holding member 15 on the guide members 14. The sensor 18 is provided to enable calculation of the speed of the ultrasonic motor from the detected value and feed back speed data to a control unit (not illustrated).

In the above description, a lens barrel device for a single-lens reflex camera has been described as the optical device. Alternatively, the present disclosure can be applied to various optical devices provided with an ultrasonic motor regardless of the type of the camera, such as a compact camera with a lens being integrally mounted in the camera main body, and an electronic still camera.

Next, the effects of the present disclosure will be described more specifically using examples and comparative examples.

A first example will be described. 70 mass % of acrylic particles as the organic particles 4 (number average particle size: 5 μm) was added:
First, as in the composition illustrated in table 1, 50 g of a two-part thermosetting epoxy adhesive (manufactured by Epoxy Technology, Inc.) was weighed as a precursor of the resin, and 35 g of acrylic particles (manufactured by Sekisui Chemical Company, Limited) having an elastic modulus of 0.48 GPa was weighed as the organic particles 4 having a number average particle size of 5 μm (70 parts by mass of the organic particles relative to 100 parts by mass of the adhesive, i.e., 70 mass % of the organic particles, were added).

The weighed adhesive and organic particles were dispersed in a 250-ml container of a mixture/dispersion device using a planetary rotator method (product name: Awatori Rentaro, manufactured by Thinky Corporation). The mixture/dispersion time was 5 minutes.

Using the prepared adhesive 9, an adhesive bonding process was performed as the next process.

The adhesive 9 was placed in a 5-cm³ syringe of a dispenser application device, a certain amount of the adhesive 9 was applied to the surface of the vibration plate 3, and the vibration plate 3 to which the adhesive 9 was applied was bonded at a pressurizing force of 0.45 MPa with the piezoelectric element 7 (PZT (longitudinal direction: 8.9 mm, transverse direction: 5.7 mm, thickness: 0.4 mm) having the silver electrode 6 (elastic modulus: 10 GPa, thickness: 2 μm)).

In the state where the vibration plate 3 and the piezoelectric element 7 were pressurized, the vibration plate 3 and the piezoelectric element 7 were placed in a constant temperature dryer, and the adhesive 9 was cured to form the adhesive layer 1, thereby obtaining the vibrator according to the exemplary embodiment. The curing time was 55 minutes at 120° C. Further, the average thickness of the adhesive layer 1 in this example was 4.1 μm.

After the vibration plate 3 and the piezoelectric element 7 were bonded with the adhesive 9, an ultrasonic flaw evaluation was made. As a result, a white portion indicating the separation of a bonding portion was not recognized in an ultrasonic image, and excellent bonding was obtained.

Next, as a result of evaluating the impedance characteristics of the ultrasonic motor, excellent characteristics exceeding the standard were obtained. The obtained results are illustrated in table 2.

A second example will be described. 70 mass % of acrylic particles as the organic particles 4 (number average particle size: 15 μm) was added:
The adhesive composition according to the second example was the same as that according to the first example, except that the number average particle size of the acrylic particles as the organic particles 4 was 15 μm. Further, the average thickness of the adhesive layer 1 in this example was 14.2 μm.

After the vibration plate 3 and the piezoelectric element 7 were bonded with the obtained adhesive 9, an ultrasonic flaw evaluation was made. As a result, a white portion indicating the separation of a bonding portion was not recognized in an ultrasonic image, and excellent bonding was obtained.

Next, as a result of evaluating the impedance characteristics of the ultrasonic motor, excellent characteristics exceeding the standard were obtained. The obtained results are illustrated in table 2.

A third example will be described. 50 mass % of an epoxy resin as the organic particles 4 (number average particle size: 10 μm) was added:
As the organic particles 4, an epoxy resin having an elastic modulus of 4.0 GPa, an average number particle size of 10 μm, and an additive amount of 50 mass % was used. Further, the average thickness of the adhesive layer 1 in this example was 9.9 μm.

After the vibration plate 3 and the piezoelectric element 7 were bonded with the obtained adhesive 9, an ultrasonic flaw evaluation was made. As a result, a white portion indicating the separation of a bonding portion was not recognized in an ultrasonic image, and excellent bonding was obtained.

Next, as a result of evaluating the impedance characteristics of the ultrasonic motor, excellent characteristics exceeding the standard were obtained. The obtained results are illustrated in table 2.

A fourth example will be described. 80 mass % of an epoxy resin as the organic particles 4 (number average particle size: 15 μm) was added:
The adhesive composition according to the fourth example was the same as that according to the third example, except that the number average particle size of the organic particles 4 was 15 μm, and the additive amount of the organic particles 4 was 80 mass %. Further, the average thickness of the adhesive layer 1 in this example was 14.8 μm.

After the vibration plate 3 and the piezoelectric element 7 were bonded with the obtained adhesive 9, an ultrasonic flaw evaluation was made. As a result, a white portion indicating the separation of a bonding portion was not recognized in an ultrasonic image, and excellent bonding was obtained.

Next, as a result of evaluating the impedance characteristics of the ultrasonic motor, excellent characteristics exceeding the standard were obtained. The obtained results are illustrated in table 2.

A fifth example will be described. Barium calcium zirconate titanate was used as the piezoelectric ceramic 2, and 70 mass % of acrylic particles as the organic particles 4 (number average particle size: 5 μm) was added:
As the adhesive 9, an epoxy/thiol-based one-part thermosetting epoxy adhesive (manufactured by Kyoritsu Chemical & Co., Ltd.), which started a curing reaction at 80° C. or below, was used.

A mixture/dispersion process for the organic particles 4 and a bonding process were similar to those in the first example.

In the state where the vibration plate 3 and the piezoelectric ceramic 2 were pressurized, the vibration plate 3 and the piezoelectric element 7 were placed in a constant temperature dryer, and the adhesive 9 was cured, thereby obtaining the vibrator according to the exemplary embodiment. The curing time was 30 minutes at 80° C.

After the vibration plate 3 and the piezoelectric element 7 were bonded with the obtained adhesive 9, an ultrasonic flaw evaluation was made. As a result, a white portion indicating the separation of a bonding portion was not recognized in an ultrasonic image, and excellent bonding was obtained.

Next, as a result of evaluating the impedance characteristics of the ultrasonic motor, excellent characteristics exceeding the standard were obtained. The obtained results are illustrated in table 2.

Comparative example 1 will be described. The organic particles 4 were not added:
The adhesive composition according to comparative example 1 was the same as that according to the first example, except that the organic particles 4 were not added. The composition is illustrated in table 1. Further, the average thickness of the adhesive layer 1 in this comparative example was 1.3 μm.

After the vibration plate 3 and the piezoelectric element 7 were bonded with the obtained adhesive 9, an ultrasonic flaw evaluation was made. As a result, a white portion indicating a partial separation of a bonding portion was recognized in 40% of an ultrasonic image, and the bonding was evaluated as "NG".

Comparative example 2 will be described. 70 mass % of an acrylic resin as the organic particles 4 (number average particle size: 3 μm) was added:

The adhesive composition according to comparative example 2 was the same as that according to the first exemplary embodiment, except that the number average particle size of the organic particles 4 was 3 μm. Further, the average thickness of the adhesive layer 1 in this comparative example was 1.8 μm.

After the vibration plate 3 and the piezoelectric element 7 were bonded with the obtained adhesive 9, an ultrasonic flaw evaluation was made. As a result, a white portion indicating the partial separation of a bonding portion was recognized in 35% of an ultrasonic image, and the bonding was evaluated as "NG".

Comparative example 3 will be described. 90 mass % of an acrylic resin as the organic particles 4 (number average particle size: 10 μm) was added: Comparative example 3 was the same as the first example, except that the number average particle size of the organic particles 4 was 10 μm, and the additive amount of the organic particles 4 was 90 mass %. Further, the average thickness of the adhesive layer 1 in this comparative example was 9.2 μm.

After the vibration plate 3 and the piezoelectric element 7 were bonded with the obtained adhesive 9, an ultrasonic flaw evaluation was made. As a result, a white portion indicating the partial separation of a bonding portion was recognized in 17% of an ultrasonic image, and the bonding was evaluated as "NG".

TABLE 1

| | | | First example | Second example | Third example | Fourth example | Fifth example | Comparative example 1 | Comparative example 2 | Comparative example 3 |
|---|---|---|---|---|---|---|---|---|---|---|
| Piezoelectric ceramic | | | PZT | PZT | PZT | PZT | Barium calcium zirconate titanate | PZT | PZT | PZT |
| Adhesive | Resin | | Epoxy | Epoxy | Epoxy | Epoxy | Epoxy | Epoxy | Epoxy | Epoxy |
| | Curing agent | | Imidazole | Imidazole | Imidazole | Imidazole | Thiol | Imidazole | Imidazole | Imidazole |
| | Organic particles | Material type | Acrylic | Acrylic | Epoxy | Epoxy | Acrylic | Not added | Acrylic | Acrylic |
| | | Average particle size/μm | 5 | 15 | 10 | 15 | 5 | | 3 | 10 |
| | | Elastic modulus/GPa | 0.48 | 0.48 | 4 | 4 | 0.48 | | 0.48 | 0.48 |
| | | Additive amount/wt % | 70 | 70 | 50 | 80 | 70 | | 70 | 90 |
| Thickness of adhesive layer | Average thickness/μm | | 4.1 | 14.2 | 9.9 | 14.8 | 4.1 | 1.3 | 1.8 | 9.2 |

TABLE 2

| | | First example | Second example | Third example | Fourth example | Fifth example | Comparative example 1 | Comparative example 2 | Comparative example 3 |
|---|---|---|---|---|---|---|---|---|---|
| Ultrasonic flaw detection | Proportion (%) of white portion | 0 | 0 | 0 | 0 | 0 | 40 | 35 | 17 |
| | Result | ○ | ○ | ○ | ○ | ○ | x | x | x |
| Ultrasonic motor | Impedance Result | ○ | ○ | ○ | ○ | ○ | x | x | x |

An ultrasonic image including a white portion was evaluated as "x", and an ultrasonic image not including a white portion was evaluated as "○".

An ultrasonic motor having impedance characteristics equal to or greater than 100 mm/sec. was evaluated as "o", and an ultrasonic motor having impedance characteristics less than 100 mm/sec. was evaluated as "x".

The ultrasonic motor according to the present exemplary embodiment can be suitably used for a camera lens.

According to the exemplary embodiment, an adhesive layer containing particular organic particles eliminates the aforementioned crack in an electrode layer, whereby it is possible to reduce interfacial separation after a vibrator is adhesively assembled.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2016-203344, filed Oct. 17, 2016, and No. 2017-180857, filed Sep. 21, 2016, which are hereby incorporated by reference herein in their entirety.

What is claimed is:

1. A vibrator comprising:
   a piezoelectric element including a piezoelectric ceramic having an electrode;
   a vibration plate; and
   an adhesive layer between the piezoelectric element and the vibration plate,
   wherein the adhesive layer is obtained by a resin containing 50 parts by mass or more and 80 parts by mass or less of organic particles having a number average particle size of 5 μm or more and 15 μm or less, relative to 100 parts by mass of the resin.

2. The vibrator according to claim 1, wherein an elastic modulus of the organic particles is 0.48 GPa or more and 10.0 GPa or less.

3. The vibrator according to claim 1, wherein the piezoelectric ceramic is lead zirconate titanate (PZT).

4. The vibrator according to claim 1, wherein the electrode is a silver electrode.

5. The vibrator according to claim 1, wherein the resin is a thermosetting resin.

6. The vibrator according to claim 5, wherein the thermosetting resin is an epoxy resin or an acrylic resin.

7. The vibrator according to claim 1, wherein a thickness of the adhesive layer is 4.1 μm or more and 14.9 μm or less.

8. An ultrasonic motor comprising:
   the vibrator according to claim 1; and
   a moving member in contact with the vibrator.

9. An optical device comprising:
   the ultrasonic motor according to claim 8; and
   optical members dynamically connected to the ultrasonic motor.

10. A method for manufacturing a vibrator including a piezoelectric element including a piezoelectric ceramic having an electrode, a vibration plate, and an adhesive layer between the piezoelectric element and the vibration plate, the method comprising:
    applying an adhesive to the vibration plate; and
    providing an adhesive layer by curing the adhesive while pressurizing the piezoelectric element against a surface of the vibration plate to which the adhesive has been applied,
    wherein the adhesive is obtained by a precursor of a resin 1 containing 50 parts by mass or more and 80 parts by mass or less of organic particles having a number average particle size of 5 μm or more and 15 μm or less, relative to 100 parts by mass of the precursor of the resin.

* * * * *